US006819561B2

(12) United States Patent
Hartzell et al.

(10) Patent No.: US 6,819,561 B2
(45) Date of Patent: Nov. 16, 2004

(54) FINNED-TUBE HEAT EXCHANGERS AND COLD PLATES, SELF-COOLING ELECTRONIC COMPONENT SYSTEMS USING SAME, AND METHODS FOR COOLING ELECTRONIC COMPONENTS USING SAME

(75) Inventors: Dennis E. Hartzell, Hudson, MA (US); John Oleksy, Maynard, MA (US); Edward J. Ognibene, Belmont, MA (US); Lyle Breaux, Metairie, LA (US)

(73) Assignee: SatCon Technology Corporation, Cambridge, MA (US)

( * ) Notice: Subject to any disclaimer, the term of this patent is extended or adjusted under 35 U.S.C. 154(b) by 43 days.

(21) Appl. No.: 10/263,468

(22) Filed: Oct. 2, 2002

(65) Prior Publication Data

US 2003/0161104 A1 Aug. 28, 2003

Related U.S. Application Data

(60) Provisional application No. 60/359,224, filed on Feb. 22, 2002.

(51) Int. Cl.[7] ................................................. H05K 7/20
(52) U.S. Cl. ....................... 361/689; 361/690; 361/699; 361/704; 174/15.1; 174/16.1; 174/16.3; 165/80.3; 165/80.4; 165/185
(58) Field of Search ................................. 361/689, 690, 361/699, 696, 698, 700, 707, 711, 715, 719; 174/15.1, 16.1, 16.3, 15.2; 165/80.3, 80.4, 104.33, 122; 257/714, 718

(56) References Cited

U.S. PATENT DOCUMENTS

| 2,017,201 A | 10/1935 | Bossart et al. .............. 257/262 |
| 2,151,540 A | 3/1939 | Varga ........................ 29/157.4 |
| 2,733,908 A | 2/1956 | Graham ........................ 263/20 |
| 3,422,518 A | 1/1969 | French et al. ............... 29/157.3 |
| 3,528,494 A | 9/1970 | Levedahl ..................... 165/105 |
| 3,643,735 A | 2/1972 | Huggins ...................... 165/172 |
| 3,662,582 A | 5/1972 | French ......................... 72/367 |
| 3,776,018 A | 12/1973 | French ......................... 72/367 |

(List continued on next page.)

FOREIGN PATENT DOCUMENTS

| DE | 40 23 533 A1 | 1/1992 |
| JP | 6-1647178 | 6/1994 |

*Primary Examiner*—Boris Chervinsky
(74) *Attorney, Agent, or Firm*—Edwards & Angell, LLP; George W. Neuner; George W. Hartnell, III

(57) ABSTRACT

The present invention provides a heat exchange system for conducting heat away from high-power, heat-producing electronic components by conduction and convection. The heat exchange system comprises a metal tube that has been forged and drawn so as to define a flow channel for a cooling fluid, wherein the tube has an inner surface that comprises a plurality of integral fins that are structured and arranged to increase the available surface area of the inner surface of the metal tube exposed to the fluid and an outer surface that is in direct communication with the heat producing components. Coolant fluids are circulated through the flow channel, preferably, at turbulent flow conditions to minimize thermal resistance. The invention further provides a self-cooling, self-supporting electronic assembly that comprising one or more high-power electronic devices, the heat exchange systems, and an attaching system for attaching high-power electronic devices to the heat exchange system. The invention further provides a method of cooling a heat producing means comprising the steps of: providing a heat exchange system that is in direct communication with the heat-producing electronic components and circulating a fluid through the heat exchange system to conduct heat away from said heat exchange system and the heat producing electronic components.

26 Claims, 8 Drawing Sheets

U.S. PATENT DOCUMENTS

| | | | |
|---|---|---|---|
| 3,794,886 A | 2/1974 | Goldman | 317/100 |
| 3,887,004 A | 6/1975 | Beck | 165/179 |
| 4,109,707 A | 8/1978 | Wilson et al. | 165/46 |
| 4,120,019 A * | 10/1978 | Arii et al. | 361/699 |
| 4,154,296 A | 5/1979 | Fijas | 165/179 |
| 4,450,472 A | 5/1984 | Tuckerman et al. | 357/82 |
| 4,514,746 A | 4/1985 | Lündqvist | 361/385 |
| 4,558,395 A | 12/1985 | Yamada et al. | 361/385 |
| 4,602,679 A | 7/1986 | Edelstein et al. | 165/104.14 |
| 4,612,978 A | 9/1986 | Cutchaw | 165/104.33 |
| 4,648,441 A | 3/1987 | Van de Sluys et al. | 165/111 |
| 4,793,405 A | 12/1988 | Diggelmann et al. | 165/104.33 |
| 4,821,389 A | 4/1989 | Nelson | 29/157.3 |
| 5,053,856 A | 10/1991 | Davidson | 357/82 |
| 5,186,250 A | 2/1993 | Ouchi et al. | 165/177 |
| 5,239,200 A * | 8/1993 | Messina et al. | 257/714 |
| 5,265,321 A | 11/1993 | Nelson et al. | 29/841 |
| 5,274,920 A | 1/1994 | Matthews | 29/890.039 |
| 5,289,869 A | 3/1994 | Klein et al. | 165/32 |
| 5,344,795 A | 9/1994 | Hashemi et al. | 437/214 |
| 5,386,629 A | 2/1995 | Ouchi et al. | 29/890.046 |
| 5,482,113 A | 1/1996 | Agonafer et al. | 165/137 |
| 5,491,363 A | 2/1996 | Yoshikawa | 257/715 |
| 5,586,598 A | 12/1996 | Tanaka et al. | 165/133 |
| 5,587,880 A | 12/1996 | Phillips et al. | 361/687 |
| 5,757,615 A | 5/1998 | Donahoe et al. | 361/687 |
| 5,797,184 A | 8/1998 | Tanaka et al. | 29/890.053 |
| 5,803,164 A | 9/1998 | Schuez et al. | 165/184 |
| 5,826,643 A | 10/1998 | Galyon et al. | 165/80.4 |
| 5,826,646 A | 10/1998 | Bae et al. | 165/110 |
| 5,946,188 A * | 8/1999 | Rochel et al. | 361/690 |
| 5,966,286 A | 10/1999 | O'Connor et al. | 361/699 |
| 5,966,291 A * | 10/1999 | Baumel et al. | 361/707 |
| 5,978,220 A * | 11/1999 | Frey et al. | 361/699 |
| 6,050,332 A * | 4/2000 | Smith et al. | 165/185 |
| 6,058,010 A * | 5/2000 | Schmidt et al. | 361/689 |
| 6,137,169 A * | 10/2000 | Pace | 257/706 |
| 6,166,907 A | 12/2000 | Chien | 361/699 |
| 6,216,771 B1 | 4/2001 | Holmberg et al. | 165/46 |
| 6,236,566 B1 * | 5/2001 | Regnier et al. | 361/699 |
| 6,263,959 B1 | 7/2001 | Ikeda et al. | 165/104.26 |
| 6,313,990 B1 | 11/2001 | Cheon | 361/699 |
| 6,360,813 B1 | 3/2002 | Katoh et al. | 165/104.33 |
| 6,462,949 B1 | 10/2002 | Parish, IV et al. | 361/699 |
| 6,473,303 B2 | 10/2002 | Kaufmann | 361/699 |
| 6,490,159 B1 | 12/2002 | Goenka et al. | 361/700 |
| 6,493,227 B2 | 12/2002 | Nielsen et al. | 361/703 |
| 6,501,654 B2 | 12/2002 | O'Connor et al. | 361/699 |
| 6,508,301 B2 | 1/2003 | Marsala | 165/80.4 |
| 6,588,647 B2 * | 7/2003 | Yamada et al. | 228/112.1 |
| 2001/0023757 A1 | 9/2001 | Huang | 165/104.26 |
| 2002/0039280 A1 | 4/2002 | O'Connor et al. | 361/690 |
| 2003/0010477 A1 | 1/2003 | Khrustalev et al. | 165/104.33 |
| 2003/0016498 A1 | 1/2003 | Kurokawa et al. | 361/699 |

* cited by examiner

FINNED-TUBE HEAT EXCHANGERS AND COLD PLATES, SELF-COOLING ELECTRONIC COMPONENT SYSTEMS USING SAME, AND METHODS FOR COOLING ELECTRONIC COMPONENTS USING SAME

CROSS-REFERENCE TO RELATED APPLICATIONS

The present invention claims priority from U.S. Provisional Application No. 60/359,224 filed Feb. 22, 2002.

FIELD OF THE INVENTION

The present invention relates to heat exchange devices, self-cooling electronic systems using same, and methods for cooling electronic devices using the same. More particularly, the present invention relates to forged, finned-tube heat exchangers and cold plates, self-cooled electronic devices using finned-tube heat exchangers to cool and support the electronic devices, and to methods for controlling the operating temperature of small, high-density, high power electronic devices using finned-tube heat exchangers.

BACKGROUND OF THE INVENTION

Thermal control of powerful electronic components is of paramount importance with systems and devices using those electronic components. Indeed, the increasingly smaller size of the electronic components advantageously enables higher density applications, which allows designers to produce smaller and smaller products. However, higher density applications produce more heat in smaller areas. Accordingly, in order to maintain the electronic components and the system itself within operable temperatures, heat removal from the heat-producing electronic components is essential.

Heat removal by thermal conduction is one means of transferring heat produced by high-power devices to ambient air. Conventional devices for conductive heat removal include heat sinks, heat exchangers, cold plates, and the like. Typically, the power device to be cooled is structured and arranged in direct or indirect thermal contact with the heat sink, heat exchanger, cold plate, and the like. The heat sink, heat exchanger, cold plate, and the like typically are fabricated of a material with high thermal conductivity to draw heat from the power device and transfer it to ambient air.

The amount of heat removed by conduction is directly proportional to the contact area between the heat source and the heat sink, heat exchanger, cold plate, and the like; the thermal conductivity of the heat sink, heat exchanger, cold plate, and the like; and the surface area of the heat sink, heat exchanger, cold plate, and the like exposed to ambient air. Thus, to enhance thermal conduction, it is not uncommon to include a plurality, or, more preferably, a multiplicity of pins or fins that extend substantially vertically from a surface of the heat sink, heat exchanger, cold plate and the like. The vertically-extending pins or fins provide additional surface area to enhance heat removal.

Alternatively or additionally, heat removal can include convection. Convection involves heat removal by the circulation of one or more fluids, e.g., air, gas, vapor, water, oil, coolant, water ethylglycol (WEG), and the like, around, through, and/or against the device, heat sink, heat exchanger, cold plate, and the like. The circulating fluid draws heat from the device, heat sink, heat exchanger, cold plate, and the like, and transports the heat to ambient air.

The amount of heat removed by convection is directly proportional to the thermal conductivity of the cooling fluid, the fluid flow rate, the size of the flow channel, and the exposed surface area past which the cooling fluid can flow. Moreover, the type of fluid flow, i.e., laminar or turbulent, can impact heat removal. For example, turbulent flow provides greater heat removal potential than laminar; however, improved heat removal comes at a price of greater pressure drops. Those skilled in the art appreciate the delicate balance that must be drawn between the type of fluid flow and the pressure loss associated with that flow in designing a convection heat sink, heat exchanger, cold plate, and the like.

Problems with the prior art include the dichotomy of making electronic components smaller and smaller, which requires heat sinks, heat exchangers, cold plates, and the like with larger surface areas to remove more heat from the electronic components. Furthermore, the heat sinks, heat exchangers, cold plates and the like of the prior art rarely provide any other function besides heat removal. For example, heat sinks, heat exchangers, cold plates, and the like have not been used to remove heat and to provide structural support to electronic components. Accordingly, there is a need for a lightweight, compact heat removing device that also can provide structural support to electronic components.

SUMMARY OF THE INVENTION

The present invention provides a lightweight, compact heat exchanger and/or cold plate for cooling or thermally controlling high-density electronic devices. The present invention further provides a self-cooling electronic component system using the compact heat exchanger and/or cold plate and a method for cooling or thermally controlling high-density electronic devices using the heat exchanger and/or cold plate.

According to one embodiment of the present invention, a heat exchanger comprises a metal tube that has been forged and drawn to form a heat exchanger and/or cold plate for cooling or thermally controlling heat-producing electronic components. According to one aspect of the present invention, the metal tube is a thick-walled tube that is forged into suitable geometries for cooling electronic devices. Preferably, forging maintains a tube wall thickness that will enable the tube to be used to support one or more heat-producing electronic components structurally. The metal tube includes an inner surface and an outer surface. The outer surface provides sufficient surface area to attach and to support one or more heat-producing electronic components. The inner surface provides an enclosed flow channel through which a fluid, e.g., air, gas, vapor, water, oil, coolant, WEG, and the like, circulates to remove heat by convection.

The inner surface of the metal tube includes a plurality of integral fins that are structured and arranged to enhance heat transfer from the metal tube to the circulating fluid. Preferably, the integral fins disposed on the inner surface of the tube have a pitch and a height-to-width ratio that optimizes the total surface area that is exposed to the cooling fluid. Moreover, the fin width, pitch, length, aspect ratio, twist angle, and disposition with respect to other integral fins can be controlled to optimize heat removal and thermal requirements and to minimize pressure drops through the metal tube. The variability of the fin structure and arrangement enables tailoring the metal tube for a myriad of uses.

Preferably, the geometry of the metal tubes exhibits a substantially rectangular or flattened round shape with a cross-sectional aspect ratio (width to depth) that ranges between about 1 to 1 to about 20 to 1. More preferably, the cross-sectional aspect ratio is at least about 4 to 1 and no more than about 5 to 1.

In a second embodiment, the present invention comprises a self-cooling, self-supporting electronic assembly that comprising:

one or more high-power electronic devices;

a heat exchange device that is in thermal communication with the one or more high-power electronic devices to support and remove heat therefrom; and an attaching system to which said one or more high-power electronic devices are releasably attached and said heat exchange device is coupled to provide rigidity, structure, and strength to the electronic assembly.

In yet another embodiment, the present invention provides a method of cooling an electronic component, the method comprising the steps of:

providing a heat exchange device that is in direct thermal communication with said one or more heat producing means, wherein the heat exchange device comprises a tube having an inner surface and an outer surface, wherein the outer surface is in thermal communication with the one or more heat-producing devices and the inner surface defines a flow channel for a cooling fluid, wherein said inner surface includes a plurality of integral fins that are structured and arranged about the flow channel to optimize heat transfer from said inner surface and said plurality of integral fins to the cooling fluid; and circulating a fluid through said heat exchange device to conduct heat away from said heat exchange device and said one or more heat producing assemblies.

DETAILED DESCRIPTION OF THE INVENTION

Figure 1:
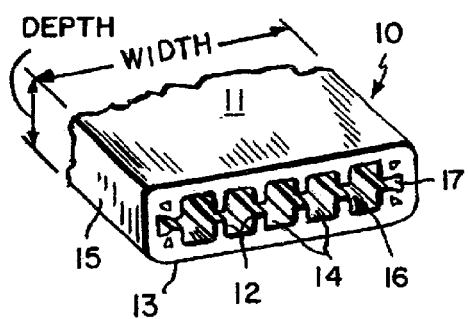
FIG. 1 shows a first illustrative embodiment of a tube heat exchanger in accordance with the present invention.

Referring now to FIG. 1, there is shown a tube heat exchanger, or cooling tube, 10 in accordance with a first embodiment of the present invention. The tube heat exchanger 10 can be manufactured from standard metal tubing stock material. Preferably, the tube heat exchanger 10 can be manufactured from metals with high thermal conductivity to enhance heat removal and conduction. More preferably, the tube heat exchanger 10 can be manufactured from thick-walled copper or copper alloy.

Although in the preferred embodiment, the tube heat exchanger 10 is fabricated from copper or copper alloy, the invention is not to be construed as being so limited. Indeed, the tube heat exchanger can be fabricated from other metals, e.g., aluminum, and/or carbonaceous materials, e.g., carbon-carbon composites, that provide high thermal conductivity.

The tube heat exchanger 10 includes an outer surface 15 that defines an outer perimeter and an inner surface 17 that defines an inner perimeter. The tube heat exchanger 10 shown in FIG. 1 is substantially rectangular in shape having a width and a depth; however, the invention is not intended to be and should not be construed as being limited to that particular geometric shape. For example, the geometric shape of the tube heat exchanger 10 also can be "rounded" rectangular. A substantially rectangular shape, however, is the preferred geometric shape because the surface area of contact between the tube heat exchanger 10 and one or more heat-producing electronic assemblies 22 can be maximized and, further, the aspect ratio, i.e., the width to depth ratio, of a rectangular tube heat exchanger 10 can optimize heat removal and thermal control.

The aspect ratio of the tube heat exchanger 10 can range between about 1 to 1 to about 20 to 1. A cooling tube 10 with a relatively large aspect ratio provides more surface area at the heat-transferring areas 11 and 13, which can enhance heat conduction. However, aspect ratios that exceed about 5 to 1 can create concavity in the heat-transferring areas 11 and 13. Concavity of the heat-transferring areas 11 and 13 diminishes heat transfer because concave portions of the heat-transferring areas 11 and 13 that are not in direct contact with the heat-producing electronic assemblies 22 are not as efficient as those that are in direct contact with heat-producing electronic assemblies 22. Furthermore, because the tube heat exchanger 10 of the present invention also can structurally support any of the heat-producing electronic assemblies 22, aspect ratios in excess of about 20 to 1 cannot support the weight of the electronic assemblies 22 without excessive or undesirable deflection. Accordingly, the preferred aspect ratio of the cooling tube 10 is about 4 to 1 or about 5 to 1.

The outer surface 15 of the tube heat exchanger 10 can include at least one of an upper heat-transferring area 11 and a lower heat-transferring area 13, either one of which or both can be used for conducting heat from heat-producing electronic assemblies 22. The upper and lower heat-transferring areas 11 and 13 are defined as that portion or those portions of the tube heat exchanger 10 to which a heat-producing electronic assembly 22 is attached, attachable or in thermal contact. As provided above, preferably, the upper and lower heat-transferring areas 11 and 13 are planar or substantially planar to maximize the direct contact area between the cooling tube 10 and the electronic assemblies 22.

The inner perimeter of the cooling tube 10 provides an enclosed flow channel 16 through which a cooling fluid, e.g., air, gas, vapor, oil, water, coolants, WEG, and the like, can circulate to remove heat by convection. The inner surface 17 of the cooling tube 10 includes a plurality of integral fins 12 that provides additional surface area to transfer, i.e., conduct, heat from the cooling tube 10.

The plurality of integral fins 12 can be structured and arranged around or along the inner perimeter of the cooling tube 10 in practically any fashion or pattern. One object of the arrangement of the plurality of integral fins 12 is to enable the fluid to maintain good contact with the inner surface 17 of the cooling tube 10 and the outer surfaces of the plurality of integral fins 12 rather than to flow down the center of the flow channel 16 or, alternatively, down the center of the plurality of flow chambers 14 that can be formed by the arrangement of the plurality of fins 12. A further object of the plurality of integral fins 12 is to produce turbulence in the flow. Heat removal can be enhanced by operating in a state of turbulent flow as opposed to a state of laminar flow.

Figure 9:
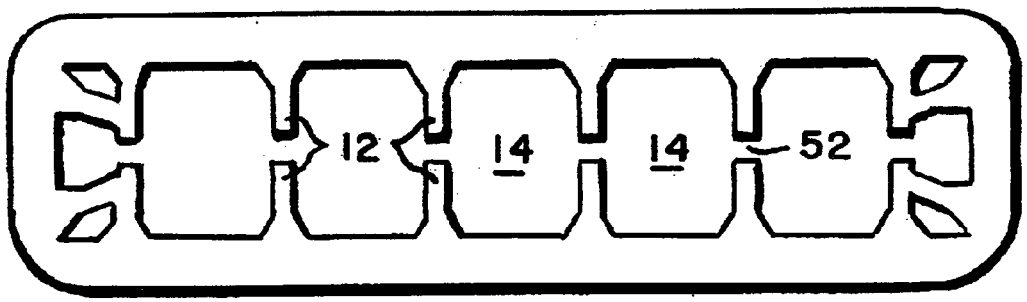
FIG. 9 shows a cross-sectional view of the first illustrative embodiment of a tube heat exchanger cross-section having an open tip-to-tip arrangement.
Figure 10:
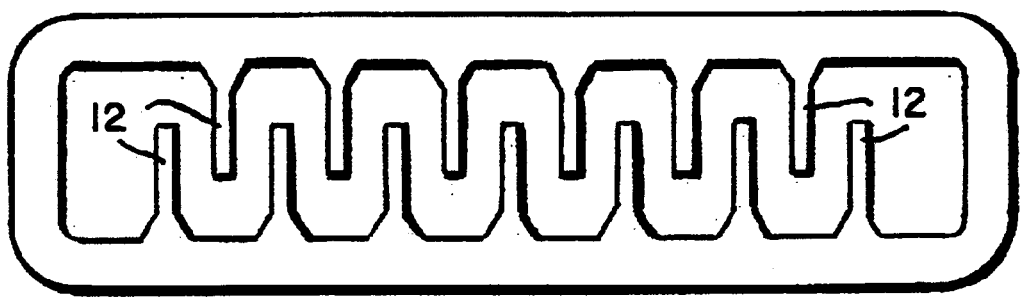
FIG. 10 shows a second illustrative embodiment of a tube heat exchanger cross-section having an interleaved arrangement.
Figure 11:
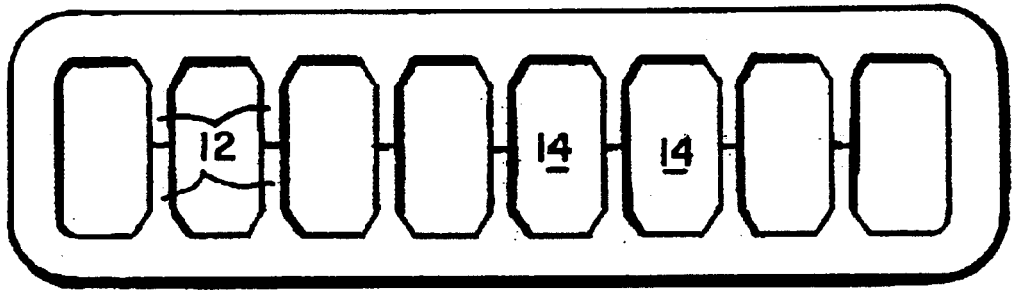
FIG. 11 shows a third illustrative embodiment of a tube heat exchanger cross-section having a "merged ends" tip-to-tip arrangement.

FIGS. 1 and 9 show an illustrative embodiment of a tip-to-tip fin arrangement 50 that includes a gap 52 between the tips of the upper and lower fins 12. A tip-to-tip fin arrangement 50 is most efficient for use in conjunction with more viscous fluids, e.g., oil, and/or when relatively high pressure drops can be tolerated. FIG. 10 provides a second illustrative embodiment of offset fins 12 that provide an interleafing arrangement 60. An interleafing arrangement 60 is most efficient for use with aggressive, double-sided, cross-clamp type systems. FIG. 11 provides a third illustrative embodiment of a tip-to-tip fin arrangement with merged ends 70, i.e., no or substantially no gap between the fin 12 tips. A merged end arrangement 70 provides optimal heat removal for a single-sided system because the tips of the upper and lower fins 12 are in direct communication with each other, which exposes more fin surface area to the circulating fluid.

Heat removal and thermal control of the cooling tube 12 can be effected further in the design of each fin 12 and the arrangement of the plurality of fins 12. For example, the width, pitch, length and twist, or skew, angle of each individual fin 12 can be controlled to design cooling tubes 10 that provide a variety of cooling capabilities. Similarly, the aspect ratio, number of integral fins 12, dimensions of the chambers 14, and the arrangement of the plurality of integral fins 12 can be controlled to do the same. Those skilled in the art can appreciate the myriad fin 12 and chamber 14 patterns that can be used to provide practically any efficacious flow channel 16 with a proper balance between turbulence and pressure loss.

Having described an embodiment of a tube heat exchanger 10, a preferred method of manufacturing the cooling tube 10 will now be described. The tube heat exchanger 10 can be manufactured from metal tubing stock, e.g., copper or copper alloy, that has been forged and then drawn in a process described in greater detail below. Preferably, the metal tubing is thick-walled tubing to withstand the forging and drawing processes without affecting the integrity of the tubing. More preferably, the metal tubing has an outer diameter of at least about 1 inch and a thickness of at least about 125 mils.

Figure 12A:
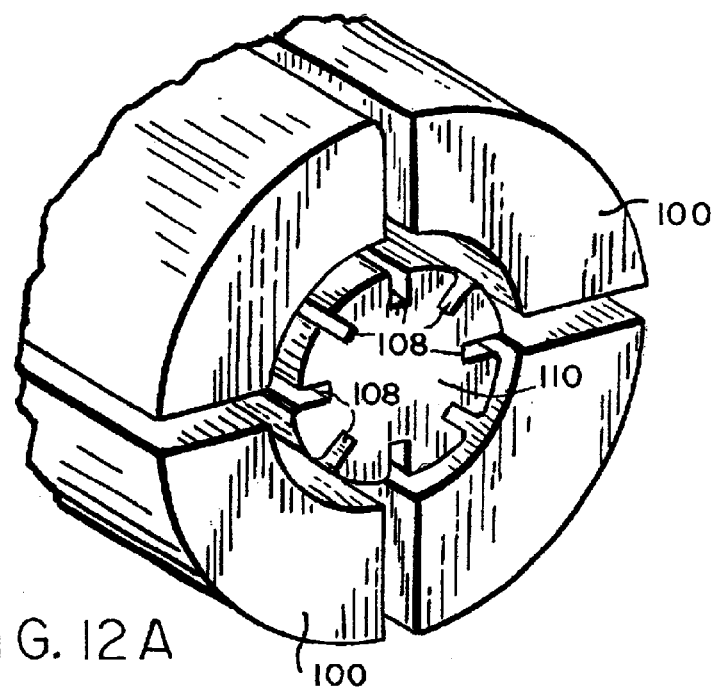
FIG. 12A shows a diagrammatic view of a mandrel and four-piece anvil.
Figure 12B:
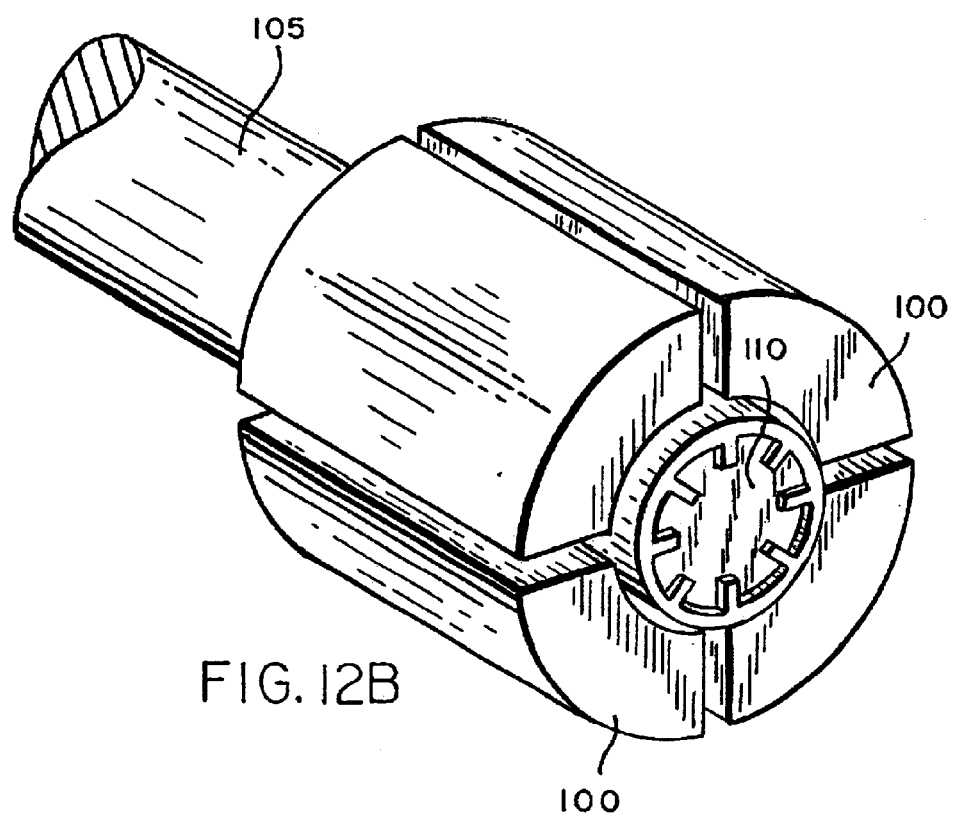
FIG. 12B shows a diagrammatic view of a forged metal tube on a mandrel and four-piece anvil.

Referring to FIGS. 12A and 12B, in one embodiment, the forging process, referred to as "swaging", can be performed using a system that comprises one or more multi-segment, e.g., four segment, anvils 100 and a grooved spline 110. For example, first, a length of thick-walled, e.g., copper, tubing 105 can be pulled or placed over the grooved spline 110 so that the spline 110 is located within the inner perimeter of the tubing 105. The spline 110 includes a plurality of grooves 108 that provide a negative image of the desired number and arrangement of the plurality of integral fins 12.

Next, the pneumatically driven anvils 100 surround the copper tubing 105 on the spline 110. By varying the pneumatic pressure to the anvils 100, the copper tubing 105 is pressed inwardly and forced into the grooves 108 to produce the plurality of fins 12, steps or variations. Preferably, the thick-walled copper tubing 105 retains a relatively thick wall after the tubing 105 is forged into the grooves 108. For example, typically, an about 120 to 125 mil thick piece of tubing 105 can have a thickness of about 60 mils after the swaging process, which will provide adequate stiffness to support itself and one or more heat-producing electronic assemblies 22. The length of copper tubing 105 then can be advanced a distance equal to the length of the anvils 100, e.g., approximately four (4) inches, and the next section of copper tubing 105 can be pressed and forced into the grooves 108 of the spline 110. This process continues until the entire length of the copper tubing 105 has been forged. The resulting end product is often referred to as a swage form.

The swaged form can then be inserted into a die, e.g., rectangular and/or "flattened" round cross section die, through which the entire length of copper tubing 105 can be drawn. The drawing process forces the forged copper tubing 105 to assume the geometric shape of the die (not shown). Preferably, the cooling tube 10 that comes out of the die provides planar, non-concave upper and lower heat-transferring surfaces 11 and 13. Concavity diminishes heat removal. Thus, flat or substantially flat heat-transferring surfaces 11 and 13 are preferred. If the cooling tube 10 exhibits concavity or some other irregularity to the heat-transferring surfaces 11 and 13, the cooing tube 10 can be end milled to make the heat-transferring surfaces 11 and 13 more planar.

The forge-and-drawing process provides a copper tubing with a substantially rectangular and/or "flattened" round cross section and, further, having a plurality of integral fins 12 that are structured and arranged to provide a desired fin arrangement having a plurality of chambers 14 or an interleafing pattern. Those skilled in the art will appreciate that the number, geometry, and/or roughness of integral fins 12 and the arrangement of the integral fins 12 can be varied to provide any desired result without violating the scope and spirit of this disclosure.

Optionally, "fish scaling", "alligator patterning", and/or rifling can be added to the inside perimeter of the cooling tube 10 before the tubing is forged. Alternatively, "fish scaling", "alligator patterning", and/or rifling can be added to the outer surface of the spline so that the pattern can be transferred to the inner perimeter of the cooling tube 10 during the forging process. Tests have shown that "fish scaling", "alligator patterning", and rifling enhance cooling by interrupting the circulation of the cooling fluid, which is to say, by causing the cooling fluid to transition from a state of laminar flow to one of turbulent flow. Indeed, thermal resistance, which is inversely proportional to heat removal, is reduced significantly when flow in the flow channel 16 is turbulent rather than laminar. Turbulence, however, causes more significant pressure drops, which, in some instances, can be detrimental. Those skilled in the art can optimize desirable lower thermal resistance and the corresponding pressure drop to provide the most efficacious system.

Another means of interrupting, or breaking the flow of the cooling fluid and providing greater heat removal is to eliminate one or more anvil strikes during the forging process. For example, after subjecting the length of copper tubing to a number of anvil compressions, a portion of the copper tubing can be left uncompressed before again compressing the anvils about the copper tubing. The uncompressed portion of the copper tubing will break the flow of the circulating fluid, which will provide greater heat removal.

Although a forge-and-drawing method of manufacturing the cooling tube 10 of the present invention has been described, other methods for manufacturing the tube heat exchanger 10 can be used. For example, aluminum and/or carbonaceous, e.g., carbon-carbon, tubes can be extruded from dies. However, the extrusion process can be more expensive than the forge-and-drawing method described above.

Figure 2:
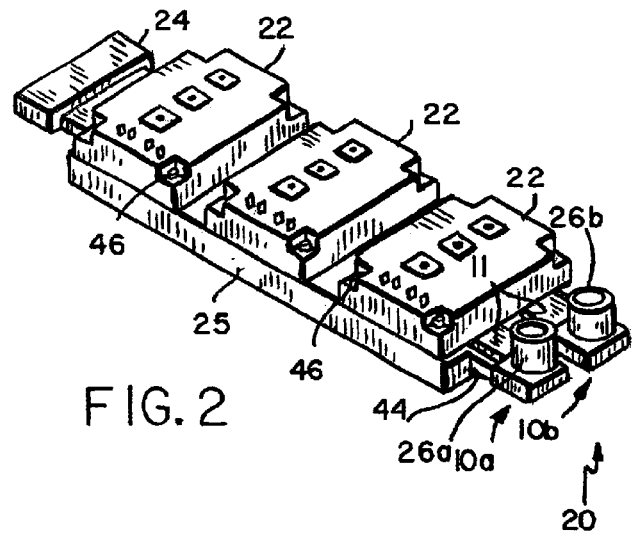
FIG. 2 shows an illustrative embodiment of a tube heat exchange system in combination with a plurality of electronic devices attached to one surface thereof.
Figure 3:
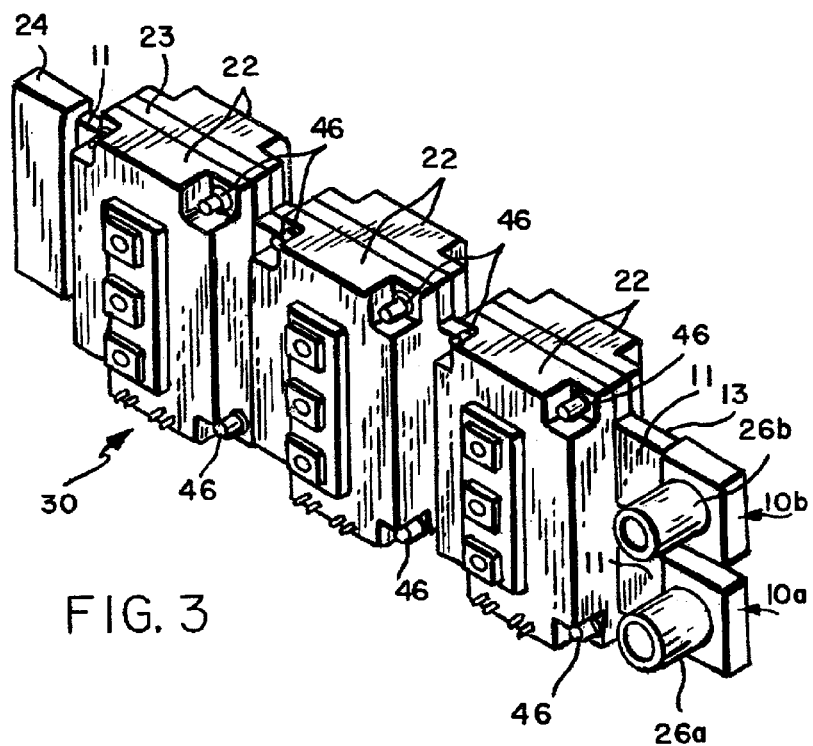
FIG. 3 shows an illustrative embodiment of a tube heat exchange system in combination with a plurality of electronic devices attached to two surfaces thereof.

Heat-producing electronic assemblies 22, e.g., high-power switch assemblies, MOSFETs, IGBTs, and the like, can be fixedly or releasably attached to one or more substantially planar surfaces, e.g., the heat-transferring areas 11 and 13, of the cooling tube 10. For example, FIG. 2 shows an exemplary embodiment of a tube heat exchange system 20 on which a plurality of high-power electronic assemblies 22, e.g., high-power switch assemblies, are structured and arranged to be in thermal communication with the upper heat-transferring surfaces 11 of a pair of tube heat exchangers 10a and 10b. According to this embodiment, the electronic assemblies 22 are releasably or fixedly attached to a, e.g., aluminum. carrier block 25 using attaching devices 46, e.g., bolts, screws, and the like. FIG. 3 shows an exemplary embodiment of a tube heat exchange system 30 on which a plurality of high-power electronic assemblies 22 are structured and arranged to be in thermal communication with an upper heat-transferring surface 11 and with a lower heat-transferring surface 13 of a pair of tube heat exchangers 10a and 10b. According to this embodiment, the heat-producing electronic assemblies 22, or "dual packs", are releasably attached to a plurality of, e.g., aluminum, spacers 23 using attaching devices 46, e.g., bolts, screws, rivets, and the like.

The cooling tubes 10a and 10b of these embodied heat exchange systems 20 and 30 are thick-walled so as to be self-supporting, which eliminates the need for separate support means for the electronic assemblies 22. Moreover, the aluminum carrier block 25 and aluminum spacers 23 provide additional rigidity to the plurality of electronic assemblies 22 and pair of cooling tubes 10a and 10b. Although this disclosure refers to and the figures depict a pair of cooling tubes 10a and 10b, those skilled in the art will appreciate that the systems can include more than two cooling tubes 10 or, alternatively, a single cooling tube 10 without violating the scope and spirit of the disclosure.

Referring to FIG. 2, there is shown a pair of substantially rectangular (in cross-section) cooling tubes 10a and 10b that are in direct thermal communication with a, e.g., aluminum, carrier block 25 and with the under side of one or more electronic assemblies 22. Preferably, the cooling tubes 10a and 10b can be set, cast or pressed into recessed slots 44 that are structured and arranged for that purpose on one face of the carrier block 25 and bonded, e.g., using an aluminum-filled epoxy. Alternatively, the cooling tubes 10a and 10b can be in tight interference fit with the recessed slots 44 of the carrier block 25. Referring to FIG. 3, there is shown a pair of substantially rectangular cooling tubes 10a and 10b that are in direct communication with one or more pairs of spacers 23, e.g., aluminum spacers, and with the undersides of one or more pairs of electronic assemblies 22 that are disposed back-to-back.

For both FIGS. 2 and 3, at a proximal end of the cooling tubes 10a and 10b is shown a pair of end fittings, or conduits, 26a and 26b that communicates with the cooling tubes 10a and 10b to deliver cooling fluid to and to remove cooling fluid from the pair of cooling tubes 10a and 10b. Fluid flow through the cooling tubes 10a and 10b can be in parallel or in series. For parallel fluid flow, a second pair of end fittings (not shown) can be structured and arranged at the distal end of the cooling tubes 10a and 10b. Accordingly, with a parallel arrangement, cooling fluid can be introduced into and removed from each cooling tube 10a and 10b via the end fittings 26a and 26b disposed at either end of the system 20. Thus, a separate cooling fluid is introduced into each of the cooling tubes 10a and 10b.

Alternatively, for series fluid flow, a return manifold 24 can be disposed at the distal end of the cooling system 20. The return manifold 24 is structured and arranged to provide communication between the flow channels 16 at the distal ends of the pair of cooling tubes 10a and 10b. Accordingly, a common cooling fluid is introduced into a first end fitting 26a, further traveling successively through the first cooling tube 10a, the return manifold 24, the second cooling tube 10b, and exiting from the second end fitting 26b.

The heat exchange system 20 works in the following manner. Heat produced by the electronic assemblies 22 is removed by conduction and convection. First, cooling tubes 10a and 10b and the carrier block 25, which are all made of excellent conductive material, draw and conduct heat away from the heat-producing electronic assemblies 22. More particularly, much of the heat from the electronic assemblies 22 will be transferred to the inner surface 17 of the cooling tube 10 and to the plurality of fins 12. Cooling fluid, e.g., air, gas, vapor, water, oil, coolant, WEG, and the like, flowing through the cooling tubes 10a and 10b draws and conducts heat away from the inner surface 17 and plurality of fins 12 in the cooling tubes 10a and 10b. As mentioned previously, turbulent fluid flow provides lower thermal resistance, which enhances the heat removal capability. Preliminary tests have shown that cooling fluid flowing through the fluid channel 16 at or above about 2 gallons per minute (GPM) will provide optimal thermal resistance. Moreover, the pressure drop at about 2 GPM was only about 0.5 pounds per square inch (PSI), which is tolerable. Those skilled in the art will appreciate that these preliminary test results are dependent on many testing variables and parameters, which include the cross-section of the cooling tubes 10a and 10b, the cooling fluids, the number, shape, dimensions (height, pitch, thickness), and clearance of the fins 12, and the like.

The carrier block 25 in FIG. 2 includes a plurality of recessed slots 44 into which the cooling tubes 10a and 10b can be disposed, e.g., set, cast or pressed and bonded. The recessed slots 44, which are structured and arranged on one face of the carrier block 25, have a width that is substantially the same as the width of the cooling tubes 10a and 10b so that when the cooling tubes 10a and 10b are inserted, e.g., pressed, into the recessed slots 44 an interference fit is produced. Furthermore, these recessed slots 44 are structured and arranged on one face of the carrier block 25 so that when the cooling tubes 10a and 10b are inserted, e.g., pressed, into the recessed slots 44, a heat-transferring area 11 of the cooling tubes 10a and 10b remains sufficiently exposed so as to be in direct communication with the electronic assemblies 22. Preferably, the electronic assemblies 22 and the substantially planar upper heat-transferring areas 11 of the cooling tubes 10a and 10b can be fixedly, e.g., soldered, or adhesively attached to each other.

Furthermore, for additional structure and strength, the one or more electronic assemblies 22 can be removably attached to the carrier block 25 using a plurality of attaching devices 46, e.g., screws, bolts, and the like. For example, the carrier block 25 can be structured and arranged to have a width of substantially the same dimension as the length of the electronic assemblies 22 that are to be attached to the cooling tubes 10a and 10b. More preferably, the electronic assemblies 22 are provided with a plurality of holes (not shown) that can align with a plurality of corresponding holes (not shown) in the carrier block 25. Once the plurality of holes in the electronic assemblies 22 and the plurality of corresponding holes in the carrier block 25 are properly aligned, attaching devices 46, e.g., screws, bolts, and the like, can then be inserted through both holes and tightened so as to removably attach each electronic assembly 22 to the carrier block 25.

In an alternative embodiment in which the electronic assemblies 22 are disposed back-to-back as shown in FIG. 3, a cross-clamp type attaching system can be used. According to this embodiment, the paired, i.e., back-to-back, electronic assemblies 22 share a common pair of cooling tubes 10a and 10b. One of the paired electronic assemblies 22 can be fixedly, e.g., soldered, or adhesively attached to an upper, substantially planar heat-transferring surface 11 and the other of the paired electronic assemblies 22 can be fixedly, e.g., soldered, or adhesively attached to a lower, substantially planar heat-transferring surface 13. Preferably, the system 30 can be assembled using a plurality of, e.g., two or three, spacers 23 for each dual pack 22 to provide a means for removably attaching the electronic assemblies 22 to the cooling tubes 10a and 10b. Each spacer 23 includes a plurality of holes (not shown). The holes in the spacers 23 are structured and arranged to be alignable with a plurality of corresponding holes (not shown) in the electronic assemblies 22.

In one aspect of this embodiment, a pair of spacers 23 is disposed at either end of the paired electronic assemblies 22 such that the holes of the spacers 23 align properly with corresponding holes in the paired electronic assemblies 22. Once the plurality of holes and the plurality of corresponding holes are aligned, attaching devices 46, e.g., nuts and bolts, rivets, and the like, can be inserted into the plurality of holes and removably secured. The attaching means 46 associated with this embodiment pass through each of the paired electronic assemblies 22 as well as the spacer 23 therebetween. When the system 30 is structured with a pair of spacers 23, the depth of the cooling tubes 10a and 10b is slightly greater than the depth of the spacers 23 to ensure direct communication between the cooling tubes 10a and 10b and the electronic assemblies 22. Optionally, a third spacer (not shown) can be disposed between the cooling tubes 10a and 10b to separate the tubes 10a and 10b and to prevent them from shifting or displacing.

Although a number of embodiments of the present invention have been described, it will become obvious to those of ordinary skill in the art that other embodiments to and/or modifications, combinations, and substitutions of the present invention are possible, all of which are within the scope and spirit of the disclosed invention.

For example, the individual spacers 23 on either end of the electronic assembly 22 pairs shown in FIG. 3 can be replaced by a single spacer (not shown) to which all of the electronic assemblies 22 can be removably attached.

Figure 4A:
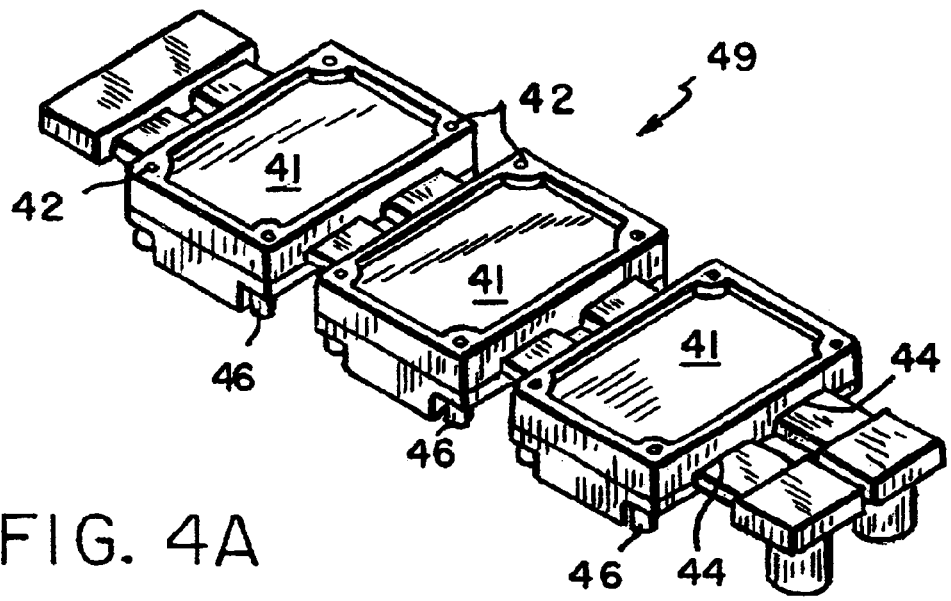
FIG. 4A shows an illustrative embodiment of a tube heat exchange system with a single-clamp type attaching means.
Figure 4B:
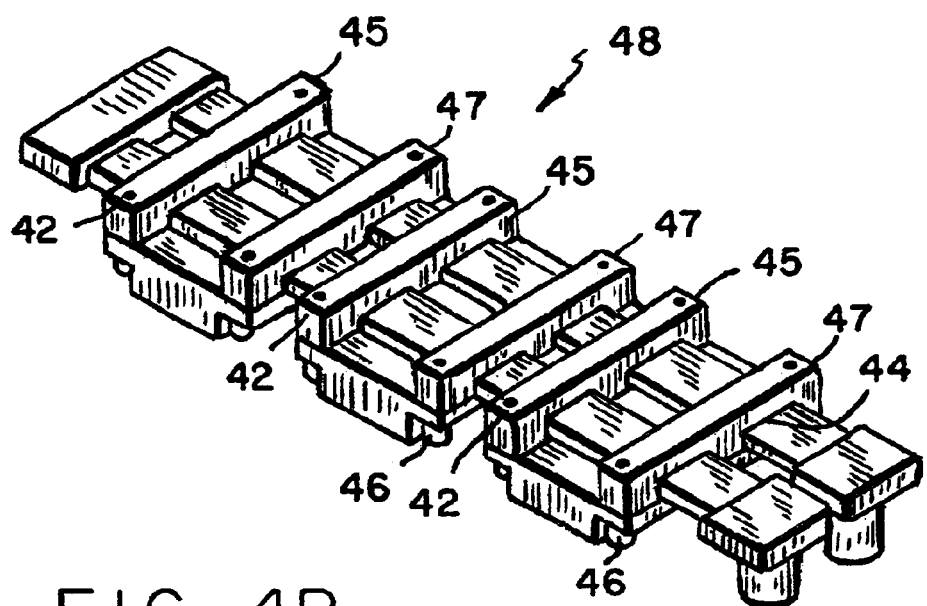
FIG. 4B shows an illustrative embodiment of a tube heat exchange system with a double-clamp type attaching means.

In another example, the, e.g., aluminum, carrier block 25 and single-sided system 20 described above can be replaced by alternative means for removably attaching the electronic assemblies 22. The advantages of the removable attachment feature include cost and the flexibility that removability affords in positioning the plurality of electronic assemblies 22 on the attaching system. FIGS. 4A and 4B depict additional illustrative embodiments of attaching systems 49 and 48.

FIG. 4A shows a single-clamp type attaching system 49 comprising a, e.g., aluminum, clamping substrate 41 and a plurality of attaching devices 46, e.g., screws, bolts, and the like. Preferably, the clamping substrate 41 is structured and arranged to have the same or substantially the same dimensions, e.g., length and width, as the electronic assembly 22 to which it is releasably attached. More preferably, the clamping substrate 41 includes a plurality of holes 42 and the electronic assemblies 22 include a plurality of corresponding holes (not shown) that align once the clamping substrate 41 and electronic assemblies 22 are properly aligned. Attaching devices 46, e.g., screws, bolts, and the like, can then be inserted in the holes to releasably attach each electronic assembly 22 to the clamping substrate 41.

The single-clamp type attaching system 49 further includes one or more recessed slots 44 into which the cooling tubes 10a and 10b can be disposed, e.g., pressed and bonded. The recessed slots 44, which are structured and arranged on one face of the clamping substrate 41, have a width that is of substantially the same dimension as the width of the cooling tubes 10a and 10b so that when the cooling tubes 10a and 10b are inserted, e.g., pressed, into the recessed slots 44 an interference fit is produced. Furthermore, these recessed slots 44 are structured and arranged on one face of the clamping substrate 41 so that when the cooling tubes 10a and 10b are inserted in the recessed slots 44 the upper heat-transferring surfaces 11 of the cooling tubes 10a and 10b remain in direct communication with the electronic assemblies 22. Preferably, the electronic assembly 22 and the substantially planar, heat-transferring surfaces 11 of the cooling tubes 10a and 10b can be fixedly, e.g., soldered, or adhesively attached to each other.

FIG. 4B illustrates an exemplary embodiment of a double-clamp attaching system 48. This attaching system 48 replaces the clamping substrate 41 of the single-clamp attaching system 49 with a pair of, e.g., aluminum, clamping substrates 45 and 47. Preferably, the pair of clamping substrates 45 and 47 is structured and arranged to have substantially the same length as the electronic assembly 22 to which it is attached. More preferably, the pair of clamping substrates 45 and 47 include a plurality of holes 42 and the electronic assemblies 22 include a plurality of corresponding holes (not shown) that align once the pair of clamping substrates 45 and 47 and the electronic assemblies 22 are properly aligned. Attaching devices 46, e.g., screws, bolts, and the like, can then be inserted in the holes to releasably attach an electronic assembly 22 to the pair of clamping substrates 45 and 47.

Each of the pair of clamping substrates 45 and 47 includes on or more recessed slots 44 into which the cooling tubes 10a and 10b can be disposed, e.g., pressed and bonded. The recessed slots 44 are structured and arranged on one face of each of the clamping substrates 45 and 47 having a width that is of substantially the same dimension as the width of the cooling tubes 10a and 10b so that when the cooling tubes 10a and 10b are inserted, e.g., pressed, into the recessed slots 44 an interference fit is produced. Furthermore, these recessed slots 44 are structured and arranged on one face of each of the clamping substrates 45 and 47 so that when the cooling tubes 10a and 10b are inserted in the recessed slots 44 the cooling tubes 10a and 10b remain in direct communication with the electronic assemblies 22 once the electronic assemblies 22 have been releasably attached to the pair of clamping substrates 45 and 47. Preferably, the electronic assemblies 22 and the substantially planar, heat-transferring surfaces 11 of the cooling tubes 10a and 10b can be fixedly, e.g., soldered, or adhesively attached to each other.

Figure 5A:
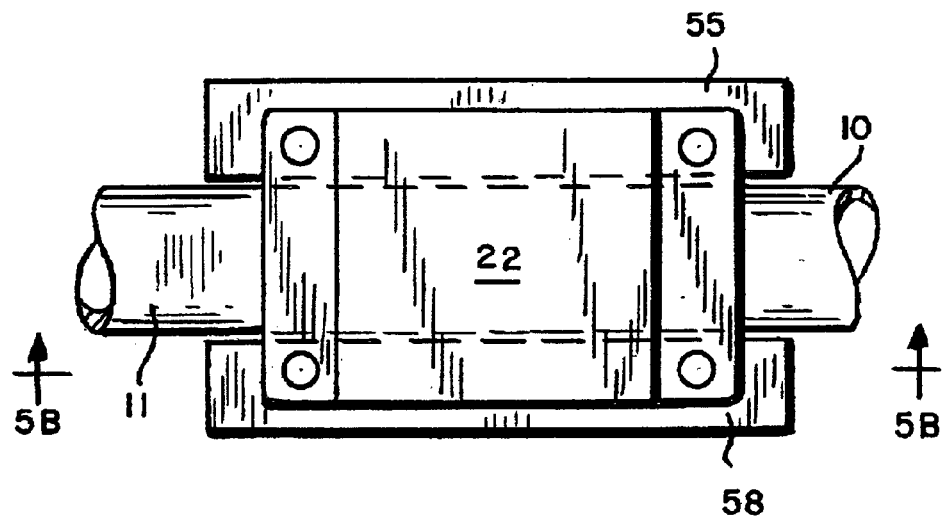
FIG. 5A shows a plan view of an illustrative embodiment of a heat-producing electronic device attached to a single tube heat exchange system using shim bars.
Figure 5B:
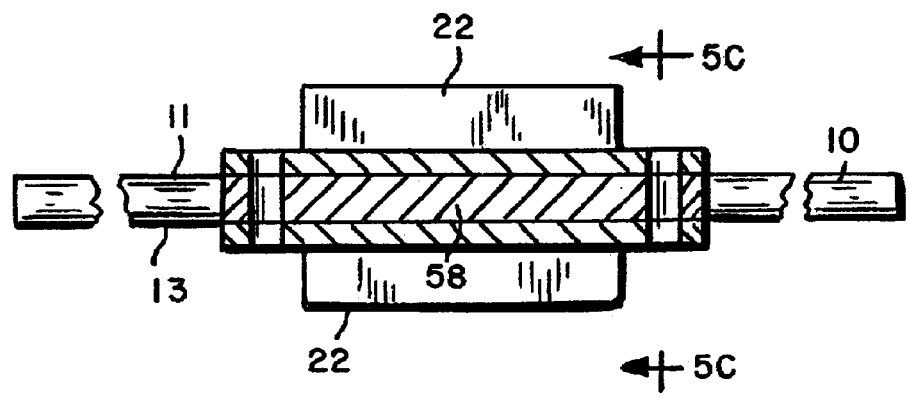
FIG. 5B shows a cross-sectional view taken from FIG. 5A of a heat-producing electronic device attached to a single tube heat exchange system using shim bars.
Figure 5C:
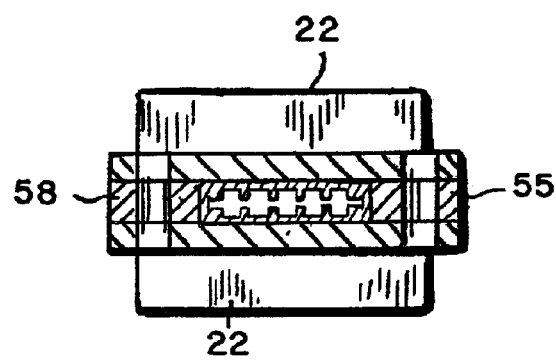
FIG. 5C shows a cross-sectional view taken from FIG. 5B heat-producing electronic device attached to a single tube heat exchange system using shim bars.

FIGS. 5A, 5B, and 5C illustrate plan and side and front elevation views, respectively, of yet another exemplary embodiment of the present invention. FIGS. 5A, 5B, and 5C show a single cooling tube 10 including a pair of shim bars 55 and 58 disposed on either side of the cooling tube 10. Preferably, the shim bars 55 and 58 are fabricated from metal, plastic, ceramic, glass, epoxy, carbon composites, and the like. As shown in the figure, one or more electronic assemblies 22 can be removably attached to the shim bars 55 and 58, for example, using bolts, screws, rivets, and the like (not shown). The shim bars 55 and 58 are structured and arranged so that when the one or more electronic assemblies 22 is or are removably attached to the cooling tube 10, the one or more electronic assemblies 22 are and remain in direct communication with one or both of the heat-transferring areas 11 and 13 to maximize heat conduction away from the electronic assemblies 22; and, further, so that the one or more electronic assemblies 22 do not damage or deform the cooling tube 10.

Figure 6A:
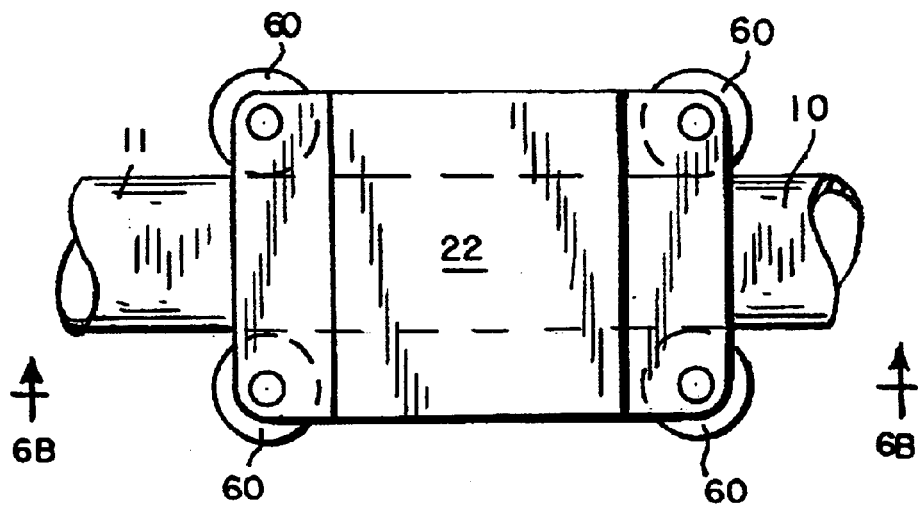
FIG. 6A shows a plan view of an illustrative embodiment of a heat-producing electronic device attached to a single tube heat exchange system using washers
Figure 6B:
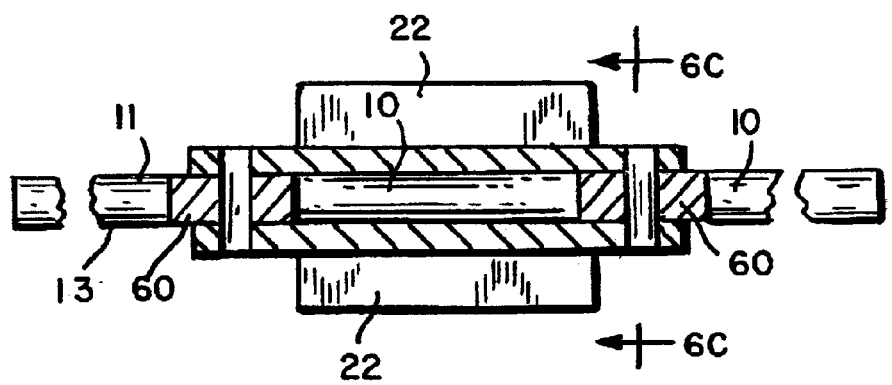
FIG. 6B shows a cross-sectional view taken from FIG. 6A of a heat-producing electronic device attached to a single tube heat exchange system using washers.
Figure 6C:
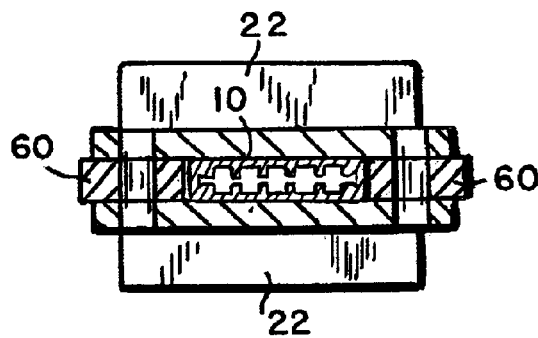
FIG. 6C shows a cross-sectional view taken from FIG. 6B heat-producing electronic device attached to a single tube heat exchange system using washers.

FIGS. 6A, 6B, and 6C illustrate plan and side and front elevation views, respectively, of yet another exemplary embodiment of the present invention similar to the embodiment just described. FIGS. 6A, 6B and 6C show a single cooling tube 10 including a plurality of washers or bushings 60 that is disposed on either side of the cooling tube 10. Preferably, the washers or bushings 60 are fabricated from metal, plastic, ceramic, glass, epoxy, carbon composites, and the like. As shown in the figure, one or more electronic assemblies 22 can be removably attached to the washers 60, for example, using bolts, screws, rivets and the like (not shown). The washers 60 are structured and arranged so that when the one or more electronic assemblies 22 is or are attached to the cooling tube 10, the one or more electronic assemblies 22 are in direct communication with one or both of the heat-transferring areas 11 and 13 to maximize heat conduction away from the electronic assemblies 22; and, further, so that the one or more electronic assemblies 22 do not damage or deform the cooling tube 10.

Figure 7A:
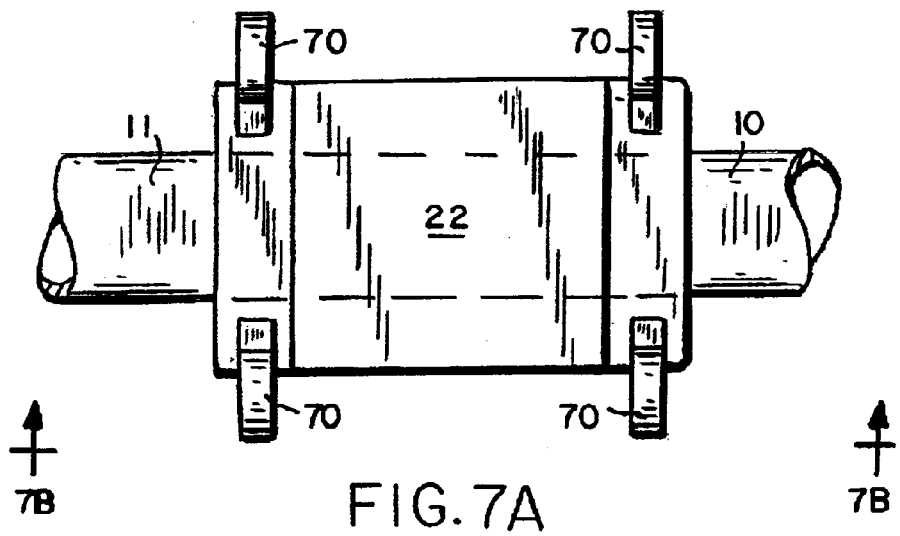
FIG. 7A shows a plan view of an illustrative embodiment of a heat-producing electronic device attached to a single tube heat exchange system using clamps.
Figure 7B:
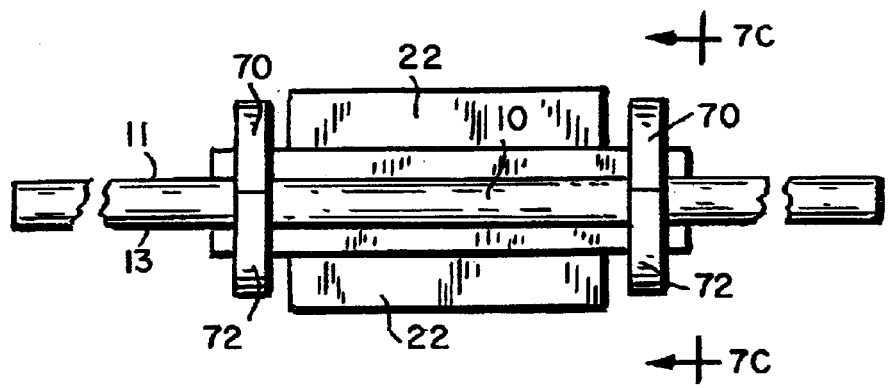
FIG. 7B shows a cross-sectional view taken from FIG. 7A of a heat-producing electronic device attached to a single tube heat exchange system using clamps.
Figure 7C:
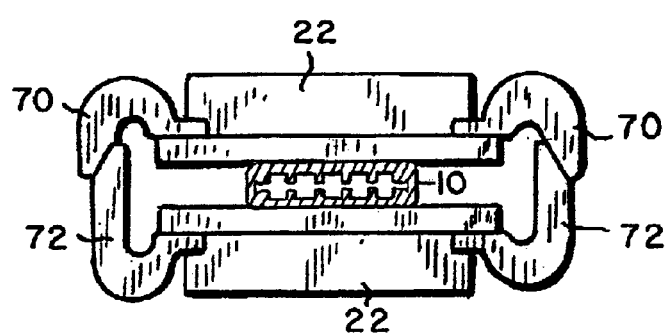
FIG. 7C shows a cross-sectional view taken from FIG. 7B heat-producing electronic device attached to a single tube heat exchange system using clamps.

FIGS. 7A, 7B, and 7C illustrate plan and side and front elevation views, respectively, of yet another exemplary embodiment of the present invention. FIGS. 7A, 7B and 7C show a single cooling tube 10 including a clamping assembly 71 comprising an upper clamp member 70 and a lower clamp member 72 that is disposed on either side of the cooling tube 10. Preferably, the clamp members 70 and 72 are fabricated from metal, plastic, ceramic, glass, epoxy, carbon composites, and the like. As shown in the figure, one or more electronic assemblies 22 can be removably attached to the cooling tube 10, for example, using clamping assemblies 71 that are disposed in each of the four corners of the electronic assemblies 22. The clamping assemblies 71 are structured and arranged so that when the one or more electronic assemblies 22 is or are attached to the cooling tube 10, the one or more electronic assemblies 22 are in direct communication with one or both of the heat-transferring areas 11 and 13 to maximize heat conduction away from the electronic assemblies 22; and, further, so that the one or more electronic assemblies 22 do not damage or deform the cooling tube 10.

Figure 8A:
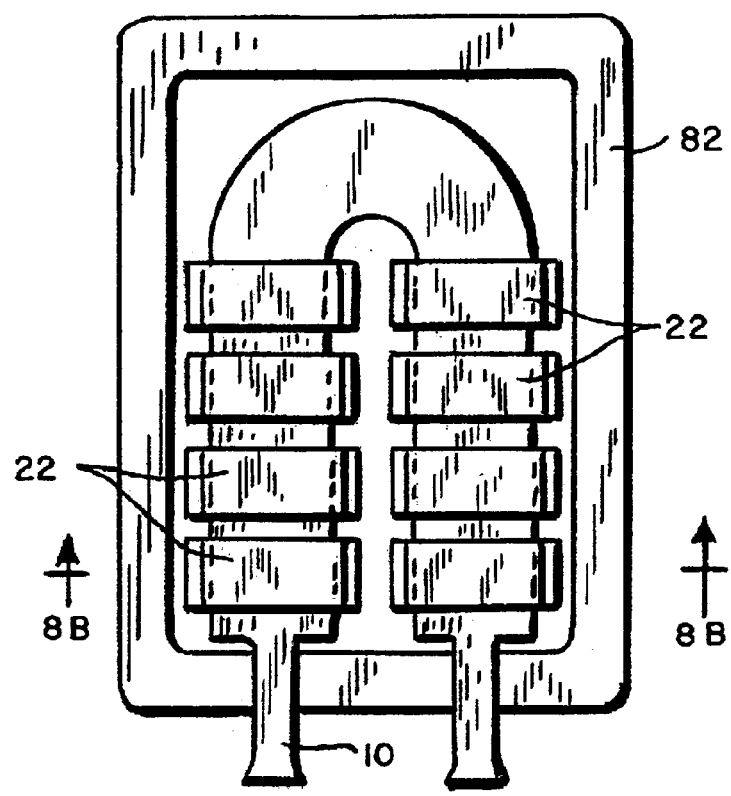
FIG. 8A shows a plan view of an illustrative embodiment of a plurality of heat-producing electronic devices attached to a single tube heat exchange system that is formed on a substrate.
Figure 8B:
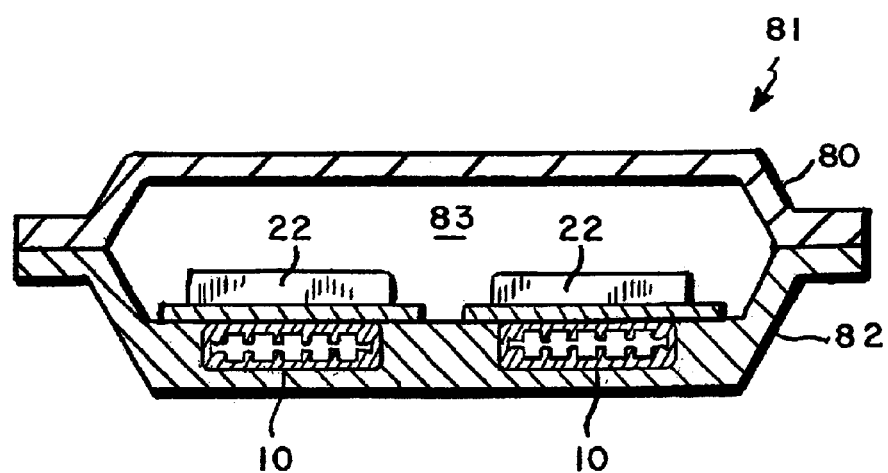
FIG. 8B shows a cross-sectional view taken from FIG. 8A of a plurality of heat-producing electronic devices attached to a single tube heat exchange system that is formed on a substrate.

FIGS. 8A and 8B illustrate plan and front elevation views, respectively, of yet another exemplary embodiment of the present invention. According to FIGS. 8A and 8B, one or more cooling tubes 10 are cast or set in a bottom molding 82, e.g., a metal or plastic molding 82. Preferably, the one or more cooling tubes 10 are set or cast so that the upper heat-transferring area 11 and the top surface 85 of the bottom molding 82 are substantially planar. As shown in the figures, one or more electronic assemblies 22 can be removably attached to the bottom moldings 82 using attaching devices, for example, using bolts, screws, rivets, and the like (not shown). The attaching devices are structured and arranged so that when the one or more electronic assemblies 22 is or are attached to the cooling tube 10, the one or more electronic assemblies 22 are in direct communication with the upper heat-transferring area 11 to maximize heat conduction away from the electronic assemblies 22; and, further, so that the one or more electronic assemblies 22 do not damage or deform the cooling tube 10.

The present embodiment also can include a top molding 80, which is removably attachable to the bottom molding 82. Preferably, the encasement 81 provided by the top and bottom moldings 80 and 82 can provide a hermetic seal so as to protect the internal components from harsh environments.

In yet another application of the present invention, cooling tubes 10 can be used with high-power magnetic assemblies by compression mounting one or more cooling tubes 10 against the sides of the magnetic core of the chokes. In yet another application, cooling tubes 10 can be used to cool motor, e.g. stator, windings. Such an application requires an array of cooling tubes 10 that are structured and arranged with manifolds at both ends. The cooling tubes 10 can then be disposed against the outer surface of one or more windings. Alternatively, the cooling tube 10 can be formed, e.g., rolled, to create a circular form that can be axially attached to one or more windings.

Furthermore, although the invention has been described in terms of electronic assemblies 22 it is not to be construed as so limited. Indeed, digital electron sub-assembly power supplies, SEMS modules, and the like can also be attached to the cooling tubes 10a and 10b to conduct away heat produced thereby.

Furthermore, if the electronic assemblies 22 are soldered to a copper cooling tube, the copper tube can also be used as a bus bar to provide electricity to the electronic assemblies 22. This embodiment requires a dielectric fluid, e.g., deionized water or Fluorinert®, as the cooling fluid.

What is claimed is:

1. A self-supporting heat exchange device for removing heat from one or more heat producing devices that are attachable to and supported structurally by the heat exchange device, said self-supporting heat exchange device comprising an integral, thick-walled tube of monolithic manufacture having an inner surface and an outer surface, wherein the outer surface is in direct thermal communication with the one or more heat-producing devices and the inner surface defines a flow channel for a cooling fluid, wherein said inner surface includes a plurality of integral fins that are structured and arranged about the flow channel to optimize heat transfer from said inner surface and said plurality of integral fins to the cooling fluid.

2. The heat exchange device as recited in claim 1, wherein the tube is fabricated monolithically from a material that has been forged over a spline to provide the plurality of integral fins on the inner surface of said tube and subsequently drawn through a die to provide a geometrical, cross-sectional shape.

3. The heat exchange device as recited in claim 1, wherein the tube is fabricated from a material selected from the group comprising metal, copper, copper alloys, aluminum, and carbonaceous materials.

4. The heat exchange device as recited in claim 1, wherein the cooling fluid is selected from a group comprising air, gas, vapor, water, oil, coolants, water ethylglycol, and any combination thereof.

5. The heat exchange device as recited in claim 2, wherein the die provides a geometrical, cross-sectional shape that is substantially rectangular with a cross-sectional, width to depth aspect ratio that ranges between about 1 to 1 and about 20 to 1.

6. The heat exchange device as recited in claim 5, wherein the die provides a geometrical, cross-sectional shape that is substantially rectangular with a cross-sectional aspect ratio that is at least about 4 to 1 but no more than about 5 to 1.

7. The heat exchange device as recited in claim 1, wherein the plurality of integral fins are structured and arranged in a pattern, wherein the pattern is selected from the group comprising an open tip-to-tip arrangement, an interleaved arrangement, and a merged end tip-to-tip arrangement.

8. The heat exchange device as recited in claim 1, wherein the plurality of integral fins disposed on the inner surface of the tube have a pitch and a height-to-width ratio to optimize the total surface area of the inner surface that is exposed to the fluid.

9. A self-cooling, self-supporting electronic assembly comprising:
one or more high-power electronic assemblies;
an integral heat exchange device of monolithic manufacture that is attached to and in direct thermal communication with the one or more high-power electronic devices,
wherein the integral heat exchange device structurally supports the one or more high-power electronic assemblies and removes heat therefrom; and
an attaching substrate to which said one or more high-power electronic devices are releasably attached and said heat exchange device is coupled to provide rigidity, structure, and strength to the electronic assembly.

10. The electronic assembly as recited in claim 9, wherein the heat exchange device comprises a thick-walled tube having an inner surface and an outer surface, wherein the outer surface is in thermal communication with the one or more high-power electronic assemblies and the inner surface defines a flow channel for a cooling fluid, wherein said inner surface includes a plurality of integral fins that are structured and arranged about the flow channel to optimize heat transfer from said inner surface and said plurality of integral fins to the cooling fluid.

11. The electronic assembly as recited in claim 9, wherein the one or more high-power electronic assemblies are selected from a group comprising electronic devices including high-power switch assemblies, MOSFETs, and IGBTs, digital electronic sub assembly power supplies, and SEMS modules.

12. The electronic assembly as recited in claim 9, wherein the attaching substrate is selected from a group comprising a carrier block, a plurality of spacers, a plurality of washers, and one or more clamping substrates.

13. The electronic assembly as recited in claim 9, wherein the attaching substrate includes one or more recessed slots into which the heat exchange device is disposed.

14. The electronic assembly as recited in claim 13, wherein the heat exchange device is in a tight interference fit with the one or more recessed slots.

15. The electronic assembly as recited in claim 13, wherein the heat exchange device is pressed into the one or more recessed slots and bonded to said one or more recesses slots.

16. The electronic assembly as recited in claim 9, wherein the electronic assembly further comprises one or more conduits through which a cooling fluid can be circulated to remove heat produced by the one or more high-power electronic assemblies by convection, wherein the one or more conduits are disposed at least one of a proximal end of the heat exchange device and a distal end of the heat exchange device.

17. The electronic assembly as recited in claim 16, wherein the one or more conduits are disposed at a proximal end of the heat exchange device and a return manifold is disposed at the distal end of the heat exchange device to circulate the cooling fluid in series.

18. The electronic assembly as recited in claim 16, wherein one or more first conduits are disposed at a proximal end of the heat exchange device and one or more second conduits are disposed at the distal end of the heat exchange device to circulate the cooling fluid in parallel.

19. The electronic assembly as recited in claim 9, wherein the one or more high-power electronic assemblies comprises a pair of high-power electronic assemblies that are structured and arranged back-to-back to one another with the heat exchange device and attaching substrate disposed therebetween.

20. The electronic assembly as recited in claim 9, wherein the heat exchange device is in cast or set in a molding.

21. A method of cooling one or more heat-producing assemblies, the method comprising the steps of:
providing a heat exchange device that is in direct thermal communication with and physically supporting said one or more heat producing means, wherein the heat exchange device comprises a tube having an inner surface and an outer surface, wherein the outer surface is in thermal communication with the one or more heat-producing devices and the inner surface defines a flow channel for a cooling fluid, wherein said inner surface includes a plurality of integral fins that are structured and arranged about the flow channel to optimize heat transfer from said inner surface and said plurality of integral fins to the cooling fluid; and circulating a fluid through said heat exchange device to conduct heat away from said heat exchange device and said one or more heat producing assemblies.

22. The electronic assembly as recited in claim 9, wherein the heat exchange device is manufactured from a material that can be used as a bus to provide electricity to the one or more electronic assemblies.

23. The electronic assembly as recited in claim 22, wherein the cooling fluid is a dielectric fluid.

24. The method as recited in claim 21, wherein the fluid is circulated in turbulent flow.

25. The method as recited in claim 21, wherein the method further comprises the step of providing an attaching system to removably attach the one or more heat-producing assemblies for greater strength and structure.

26. The method as recited in claim 21, wherein the heat exchange device is fabricated by a process comprising the steps of:

forging a thick-walled tube to provide the heat exchange device with a plurality of integral fins on an inner surface thereof; and drawing the forged thick-walled tube through a die to provide said heat exchange device with a desired geometrical, cross-sectional shape.

* * * * *